United States Patent
Sugimoto et al.

[11] Patent Number: 6,108,192
[45] Date of Patent: Aug. 22, 2000

[54] DIELECTRIC CERAMIC COMPOSITION AND CERAMIC ELECTRONIC PARTS USING THE SAME

[75] Inventors: Yasutaka Sugimoto, Kyoto; Hirofumi Sunahara, Moriyama; Kimihide Sugou, Souraku-gun; Hiroshi Takagi, Otsu, all of Japan

[73] Assignee: Murata Manufacturing Co., Ltd., Japan

[21] Appl. No.: 09/210,051

[22] Filed: Dec. 11, 1998

[30] Foreign Application Priority Data

Dec. 11, 1997 [JP] Japan ................................. 9-341491
Nov. 4, 1998 [JP] Japan ................................ 10-313339

[51] Int. Cl.$^7$ ............................. H01G 4/06; C04B 35/46
[52] U.S. Cl. ............................ 361/321.1; 361/321.4; 361/321.5; 501/134; 501/135; 501/136
[58] Field of Search ............................. 361/311, 312, 361/313, 321.1, 321.2, 321.3, 321.4, 321.5, 320, 322; 501/134, 135, 136, 137

[56] References Cited

U.S. PATENT DOCUMENTS 4,885,661  12/1989  Yokotani et al. .

FOREIGN PATENT DOCUMENTS

| | | |
|---|---|---|
| 0376670A2 | 12/1989 | European Pat. Off. . |
| 0376670A2 | 7/1990 | European Pat. Off. . |
| 0413321A1 | 2/1991 | European Pat. Off. . |
| 0504756A1 | 3/1992 | European Pat. Off. . |
| 0504756A1 | 9/1992 | European Pat. Off. . |
| 0740310A1 | 4/1996 | European Pat. Off. . |
| 0740310A1 | 10/1996 | European Pat. Off. . |

OTHER PUBLICATIONS

Database WPI Week 9522, Derwent Publications Ltd., London GB; AN 1995–164968; XP002116614 & JP 07 086079 A (Taiyo Yuden), Mar. 31, 1995; Abstract.

*Primary Examiner*—Kristine Kincaid
*Assistant Examiner*—Anthony Dinkins
*Attorney, Agent, or Firm*—Ostrolenik, Faber, Gerb & Soffen, LLP

[57] ABSTRACT

A dielectric ceramic composition is formed of a mixture including a $BaO-TiO_2-REO_{3/2}$ ceramic composition, wherein RE represents a rare earth element, and a glass composition containing about 13–50 wt. % $SiO_2$, about 3–30 wt. % $B_2O_3$, about 40–80 wt. % alkaline earth metal oxide and about 0.5–10 wt. % $Li_2O$. The dielectric ceramic composition has a high dielectric constant and a high Q value, as well as excellent temperature stability, and is capable of being sintered at a relatively low temperature. The dielectric ceramic composition is advantageously used in ceramic electronic parts.

16 Claims, 3 Drawing Sheets

DIELECTRIC CERAMIC COMPOSITION AND CERAMIC ELECTRONIC PARTS USING THE SAME

BACKGROUND OF THE INVENTION

1. Field of the Invention

The present invention relates generally to a dielectric ceramic composition, which is a glass-ceramic composite material for low temperature firing, and more particularly, to a dielectric composition for use in a microwave resonator, a LC filter, a laminated capacitor, and a multilayered circuit board or the like.

2. Description of the Related Art

With miniaturizing of the electronic devices such as microwave resonators and microwave filters, efforts have been made to replace cavity resonators with ceramic dielectrics having a high relative dielectric constant. Resonators and the filters are miniaturized by use of an effect that a wavelength of electromagnetic waves in dielectrics is shortened to $1/\epsilon r^{1/2}$ times that in free space, wherein $\epsilon r$ represents the relative dielectric constant of dielectrics.

However, the dielectric material has not met the recent demand for further miniaturization since the relative dielectric constant $\epsilon r$ of a ceramic dielectric material having a temperature coefficient suitable for use as a dielectric resonator has so far been limited to 100 or less.

A method employing an LC resonator, which has conventionally been known in microwave circuits, is effective for meeting the demand under restriction of a relative dielectric constant $\epsilon r$ of a ceramic dielectric material. Thus, a further miniaturized electronic apparatus having high reliability may be produced by applying to fabrication of LC circuits a lamination method which is adapted in practice for a laminated capacitor and a multilayered board.

However, producing an LC resonator having a high Q value in a microwave region by way of a lamination method requires high electric conductivity of an internal electrode which is built into the laminated capacitor and the multilayered circuit board. A metal having high electric conductivity such as gold, silver or copper must be used for the internal electrode which is fired simultaneously with a dielectric or a multilayered circuit board. For this reason, a dielectric material must be able to be sintered at low temperature simultaneously with internal electrodes formed of a metal material having a low melting point, and as well must have a high dielectric constant, a high Q value and enhanced temperature stability. However, a dielectric material which meets all of these criteria has not yet been found.

SUMMARY OF THE INVENTION

An object of the present invention is to provide a dielectric ceramic composition which has a high relative dielectric constant, a high Q value and temperature stability, and which is capable of being sintered at relatively low temperature.

Another object of the present invention is to provide ceramic electronic parts which have excellent high-frequency characteristics and are able to be miniaturized.

In one aspect of the present invention, there is provided a dielectric ceramic composition formed of a mixture comprising a first $BaO$—$TiO_2$—$REO_{3/2}$ ceramic composition (RE represents a rare earth element) and a glass composition, wherein the glass composition comprises about 13–50 wt. % $SiO_2$, about 3–30 wt. % $B_2O_3$, about 40–80 wt. % alkaline earth metal oxide and about 0.5–10 wt. % $Li_2O$. Examples of rare earth elements RE include Sc, Y, La, Ce, Pr, Nd, Pm, Sm, Eu, Gd, Tb, Dy, Ho, Er, Tm, Yb and Lu, and these elements may be used singly or in combination as desired.

Preferably, the above-described dielectric ceramic composition contains CuO as a secondary component.

The above-described first $BaO$—$TiO_2$—$REO_{3/2}$ ceramic composition may be represented by $xBaO$—$yTiO_2$—$zREO_{3/2}$, wherein x, y, and z are based on mole % and satisfy the following relations: $5 \leq x \leq 15$, $52.5 \leq y \leq 70$, $15 \leq z \leq 42.5$; and $x+y+z=100$, and contains PbO in an amount of about 20 parts by weight or less with respect to 100 parts by weight of the first ceramic composition.

The alkaline earth metal oxide contained in the above-described glass composition preferably comprises BaO and at least one species selected from the group consisting of SrO, CaO and MgO, and the compositional proportions of SrO, CaO, MgO and BaO fall within the ranges of about 35 wt. % or less, about 35 wt. % or less, about 20 wt. % or less and about 40–95 wt. %, respectively.

The above-described dielectric ceramic composition is preferably such that the first ceramic composition accounts for about 80–95 wt. %, the glass composition accounts for about 5–20 wt. % and CuO accounts for about 3 wt. % or less.

Preferably, the dielectric ceramic composition of the present invention further comprises at least one species of a ceramic compound selected from the group consisting of $TiO_2$, $CaTiO_3$, $SrTiO_3$ and $Nd_2Ti_2O_7$. As used herein, these ceramic compounds are referred to as "second ceramic compositions" for the sake of contrast with the aforementioned first ceramic composition.

In this case, the first ceramic composition accounts for about 50–95 wt. %, the glass composition accounts for about 5–20 wt. %, CuO accounts for about 3 wt. % or less and the second ceramic composition accounts for about 30 wt. % or less.

In another aspect of the present invention, there is provided a ceramic electronic part characterized by utilizing the dielectric ceramic compositions as a dielectric ceramic layer.

According to the present invention, since a dielectric ceramic composition is formed of a mixture comprising a first $BaO$—$TiO_2$—$REO_{3/2}$ ceramic composition (RE represents a rare earth element) and an $SiO_2$—$B_2O_3$-alkaline earth metal oxide-$Li_2O$ glass composition, it can be sintered at a temperature lower than the melting point of an electric conductor containing, as a primary component, a low specific-resistance metal selected from silver, gold and copper. Moreover, the present invention successfully provides a dielectric ceramic composition having a high relative dielectric constant within a high-frequency region, particularly within a microwave region and a millimeter wave region, as well as excellent temperature stability.

Addition of CuO, as a secondary component, to the mixture comprising a first ceramic composition and a glass composition further lowers sintering temperature of the resultant mixture and increases the Q value and the relative dielectric constant thereof.

Therefore, when used as a dielectric ceramic layer, such a dielectric ceramic composition can be fired simultaneously with a low specific-resistance internal electrode made of gold, silver copper, etc., to thereby yield ceramic electronic parts such as dielectrics and multilayer circuit boards containing such an internal electrode therein and having excellent high-frequency characteristics. Ceramic electronic parts such as LC resonators and LC filters having a high Q value can be further miniaturized by use of a lamination method and the dielectric ceramic composition as a dielectric ceramic layer.

In the present invention, the above-described dielectric ceramic composition encompasses a powder comprising a mixture of the first ceramic composition and the glass composition (and optionally the second ceramic composition); a paste composition in which the powder composition is dispersed in a medium such as an organic vehicle; a ceramic green sheet obtained by forming the paste composition; and a ceramic composition obtained by firing the green sheet.

DETAILED DESCRIPTION OF THE INVENTION

Figure 1:
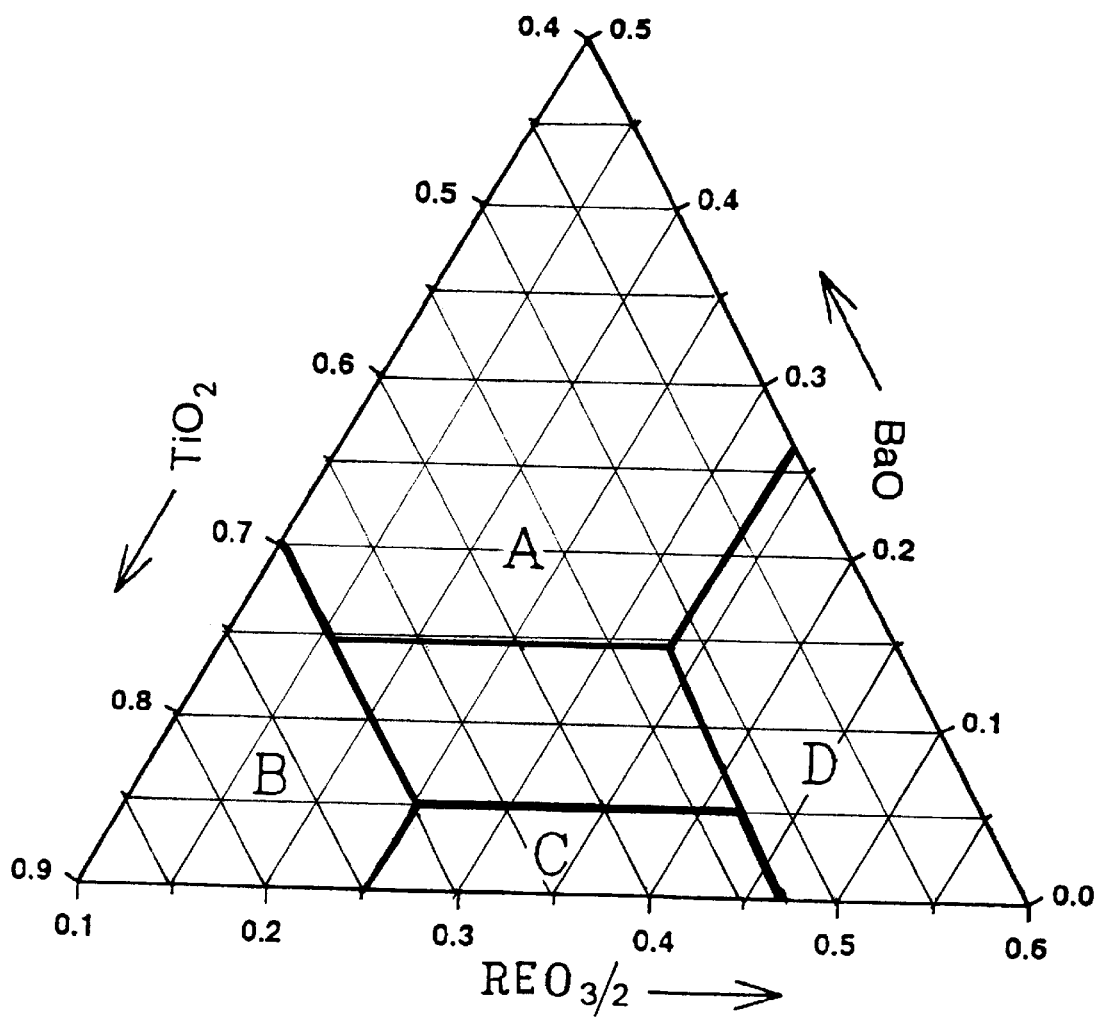
FIG. 1 is a ternary diagram of a $BaO$—$TiO_2$—$REO_{3/2}$ ceramic composition.

FIG. 1 shows a ternary diagram referring to the compositional ranges of a first $BaO$—$TiO_2$—$REO_{3/2}$ ceramic composition which is a primary component of the first ceramic composition used in the dielectric ceramic composition according to the present invention. The compositional proportions of the $BaO$—$TiO_2$—$REO_{3/2}$ ceramic composition, when represented by $xBaO$—$yTiO_2$—$REO_{3/2}$, are such that x, y, and z fall within the ranges satisfying $5 \leq x \leq 15$, $52.5 \leq y \leq 70$, $15 \leq z \leq 42.5$; and $x+y+z=100$ on a mole % basis, and the composition preferably falls within the domain indicated by oblique lines in FIG. 1.

In contrast, a composition falling within the domain A is difficult to sinter and in some cases does not provide a porous ceramic even at 1400° C., which is the conventional sintering temperature. When a composition falls within the domain B, the temperature-dependent characteristic, i.e., the temperature coefficient of dielectric constant of a capacitor formed inside a multilayered circuit board, tends to decrease drastically onto the negative side. When a composition falls within the domain C, the relative dielectric constant is extremely small and in some cases the sintered property is not good. Furthermore, when a composition falls within the domain D, the temperature coefficient of dielectric constant increases drastically onto the positive side and the relative dielectric constant tends to decrease.

The first ceramic composition used in the dielectric ceramic composition according to the present invention preferably contains about 20 parts by weight or less of PbO in addition to a $BaO$—$TiO_2$—$REO_{3/2}$ ceramic composition which falls within the compositional domain indicated by oblique lines in FIG. 1. In practice, addition of PbO provides a dielectric ceramic composition having better stabilized characteristics; however, addition of PbO in excess of about 20 parts by weight makes the temperature coefficient of change in dielectric constant negative and high, and the Q value decreases.

The glass composition will next be described. The glass composition comprises about 13–50 wt. % $SiO_2$, about 3–30 wt. % $B_2O_3$, about 40–80 wt. % alkaline earth metal oxide (BaO, SrO, CaO, MgO) and about 0.5–10 wt. % $Li_2O$.

$B_2O_3$ contained in the glass composition lowers the glass viscosity and accelerates sintering of a dielectric ceramic composition. However, when the content of $B_2O_3$ is in excess of about 30 wt. %, moisture resistance is adversely affected; whereas when it is less than about 3 wt. %, the composition is not sintered at about 1000° C. or less.

When the content of $SiO_2$ is in excess of about 50 wt. %, the glass softening temperature increases drastically and ceramic compositions containing $SiO_2$ in such a high amount cannot be sintered; whereas when it is less than about 13 wt. %, moisture resistance is adversely affected.

The alkaline earth metal oxide promotes reaction between the ceramic composition and the glass composition and lowers the softening point of the glass composition. When the content of the alkaline earth metal oxide is less than about 40 wt. %, the sintered property decreases to induce difficulty in sintering at about 1000° C. or less; whereas when it is in excess of about 80 wt. %, moisture resistance is adversely affected.

When the content of BaO in the alkaline earth metal oxide is in excess of about 95 wt. %, moisture resistance is adversely affected; whereas when it is less than about 40 wt. %, the sinterability might decrease. In view of moisture resistance, the composition preferably contains at least one of SrO, CaO and MgO in an amount of about 5 wt. % or more.

$Li_2O$ lowers the glass softening point. However, when the $Li_2O$ content is in excess of about 10 wt. %, moisture resistance is unsatisfactory; whereas when it is less than about 0.5 wt. %, the softening point increases drastically to prevent sintering.

When the amount of the glass composition contained in the dielectric ceramic composition is less than about 5 wt. %, sintering might be difficult; whereas when it is in excess of about 20 wt. %, moisture resistance might deteriorate to lower the relative dielectric constant.

CuO also functions as a sintering aid. When the content is in excess of about 3 wt. %, the Q value tends to decrease to shift the temperature coefficient of dielectric constant to a high positive value.

Each of $TiO_2$, $CaTiO_3$ and $SrTiO_3$ which serve as the second ceramic composition has a negative temperature coefficient of dielectric constant, whereas $Nd_2Ti_2O_7$ is a composition having a positive temperature coefficient of dielectric constant. Briefly, in the present invention, there is incorporated, as an additive for modifying temperature characteristic, at least one species of a second ceramic composition selected from the group consisting of $TiO_2$, $CaTiO_3$, $SrTiO_3$ and $Nd_2Ti_2O_7$, in an appropriate amount into a mixture comprising the first ceramic composition and the glass composition, to thereby preset the temperature characteristic of the dielectric ceramic composition of the present invention to a desired value.

When the second ceramic composition is incorporated into the dielectric composition of the present invention, preferably, the first ceramic composition accounts for about 50–95 wt. %, the glass composition accounts for about 5–20 wt. %, CuO accounts for about 3 wt. % or less and the second ceramic composition accounts for about 30 wt. % or less. When the content of the second ceramic composition is in excess of about 30 wt. %, the sinterability of the dielectric ceramic composition of the present invention tends to deteriorate. The first ceramic composition is preferably contained in an amount of about 50–95 wt. %. When the content is less than about 50 wt. % (or when the glass composition is incorporated in an amount of more than about 20 wt. %), the sintered property of the ceramic composition (or the dielectric constant) tends to deteriorate; whereas when the content of the first ceramic composition is in excess of about 95 wt. %, the sintered property of the ceramic composition may also deteriorate.

As one embodiment of the ceramic electronic parts of the present invention, an LC filter will next be described with reference to FIGS. 2 through 4.

A paste composition is prepared by adding an organic vehicle to the powder composition corresponding to the dielectric ceramic composition of the present invention, and the paste composition is formed into a ceramic green sheet having a thickness of, e.g., 40 μm through a casting method by use of a doctor blade. The sheet is dried and punched to provide a piece having a predetermined size.

Figure 2:
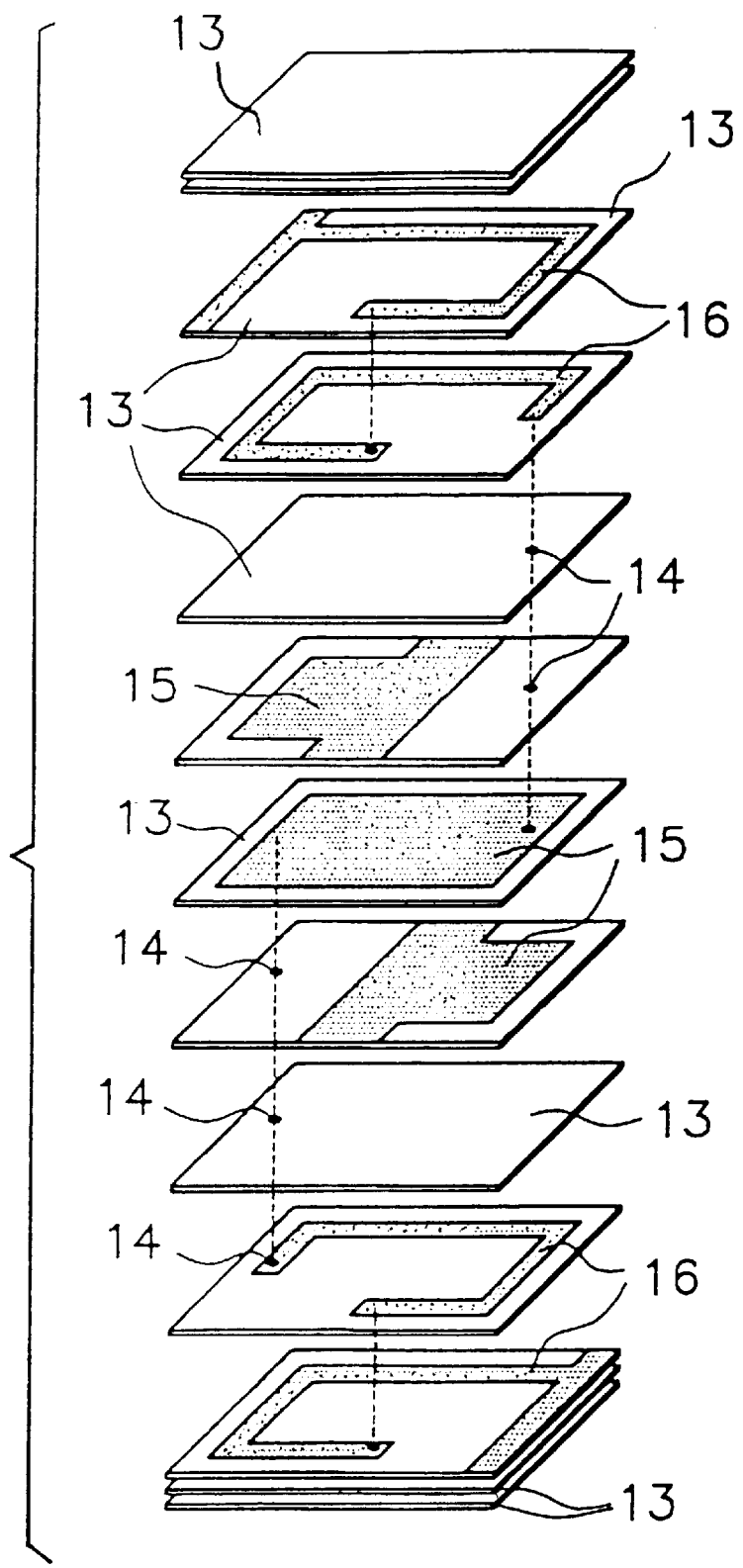
FIG. 2 is a fragmentary perspective view of an LC filter employing the ceramic electronic parts of the present invention.

As shown in FIG. 2, via-holes 14 are formed by use of, e.g., a silver paste in the obtained ceramic green sheets 13, if required, and capacitor patterns 15 and coil patterns 16 are subsequently formed by use of, e.g., a silver paste through screen printing. Then, the green sheets are laminated and pressed, to form a laminated sheet.

The laminated sheet is fired at, e.g., 900° C., and then outer contacts 17, 18, 19, and 20 (FIG. 3) are formed, to thereby obtain an LC filter 10 having a capacitor C1 and coils L1 and L2 therein. FIG. 4 shows an equivalent circuit of the LC filter 10.

Since the LC filter 10 employs the dielectric ceramic composition of the present invention as a dielectric ceramic layer, it can be produced by simultaneous sintering with an electrically conductive material as an internal conductor layer containing, as a primary component, a low specific-resistance metal selected from gold, silver and copper. Moreover, the filter has high-frequency characteristics within the microwave region and the millimeter wave region and excellent temperature stability, and can be sufficiently miniaturized.

Figure 3:
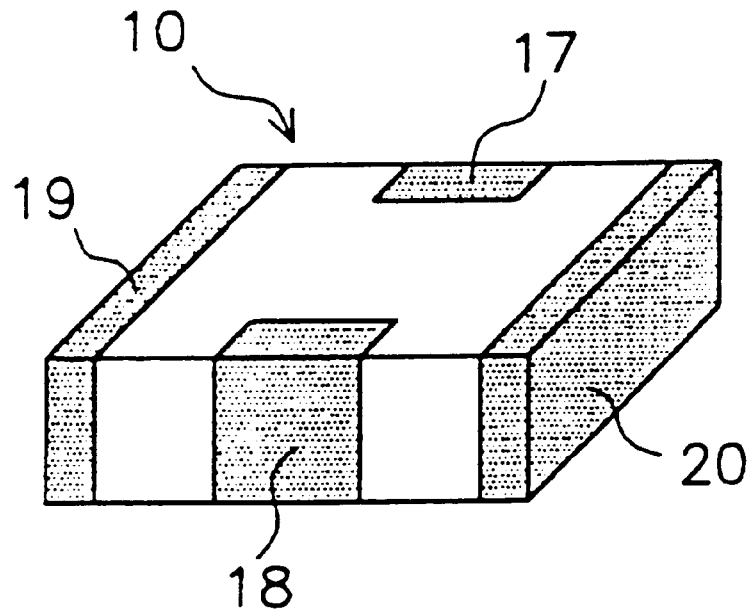
FIG. 3 is a schematic perspective view of the LC filter.
Figure 4:
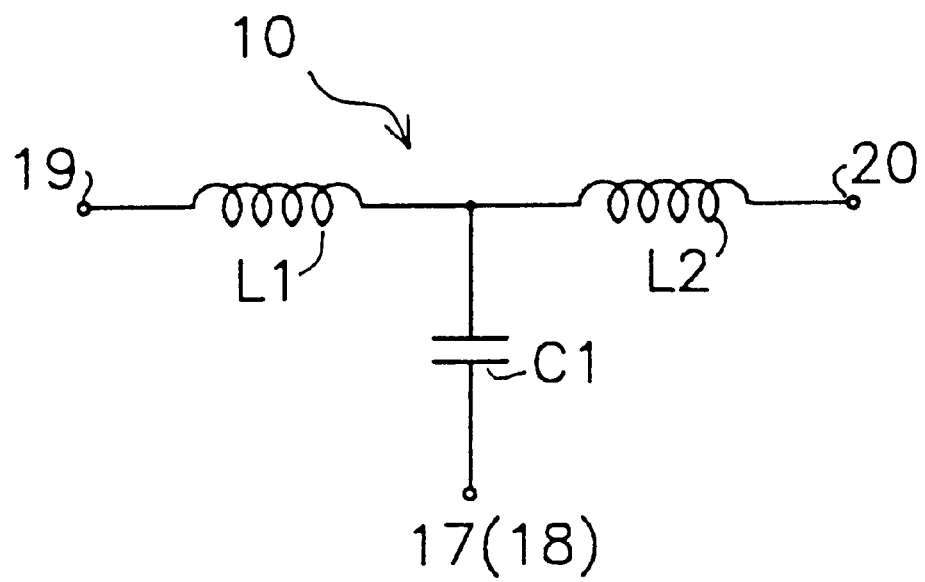
FIG. 4 is a circuit diagram of the LC filter.

In addition to an LC filter shown in FIGS. 2 through 4, examples of the ceramic electronic parts of the present invention include chip parts such as LC resonators, laminated chip capacitors, and chip antennas; and ceramic substrates (or ceramic multilayered substrates) such as ceramic substrates for hybrid ICs, VOCs, multichip modules, ceramic packages, etc.

In addition to a method for producing the ceramic electronic parts of the present invention by shaping the dielectric ceramic composition of the present invention into a green sheet, laminating, and firing; the ceramic electronic parts may be produced by forming a paste composition of the dielectric ceramic composition of the present invention and printing the paste composition to a thick film.

EXAMPLES

The dielectric ceramic composition of the present invention will next be described by way of examples.

Production of First Ceramic Compositions $BaCO_3$, $TiO_2$, $Nd_2O_3$, $La_2O_3$, $Pr_2O_3$ and $Sm_2O_3$ were weighed and mixed together to obtain mixtures having compositional ratios with regard to BaO, $TiO_2$ and $REO_{3/2}$ indicated in the columns showing primary components in Table 1. Then, PbO powder was added to each of the above mixtures so as to realize a compositional ratio (parts by weight based on 100 parts of the primary component) indicated in the column showing a secondary component in Table 1, and the resultant mixture was mixed thoroughly. The mixture was calcined at 1150° C. for one hour to form a calcined compact, which was then crushed and mixed. The mixture was then fired at 1300–1400° C. to thereby obtain a ceramic. Ceramic compositions S1 through S25 shown in Table 1 were produced by crushing the corresponding ceramics again. The obtained ceramics were subjected to measurement of relative dielectric constant, Q value and temperature coefficient of change in capacitance. Results of the measurements are shown in Table 1. These first ceramic compositions were used to prepare dielectric ceramic compositions shown below.

TABLE 1

| First ceramic composition | Primary component (mole %) | | | Secondary component (parts by weight) | Relative dielectric | | Temperature coefficient of dielectric constant |
|---|---|---|---|---|---|---|---|
| No. | BaO | $TiO_2$ | $REO_{3/2}$ | PbO | constant (εr) | Q value | (ppm/° C.) |
| S1 | 10 | 63 | Nd:27 | 13 | 95 | 5000 | −5 |
| S2 | 15 | 70 | Nd:15 | 13 | 85 | 2500 | −80 |
| S3 | 15 | 55 | Nd:30 | 13 | 80 | 3000 | −100 |
| S4 | 5 | 70 | Nd:25 | 13 | 65 | 4000 | −70 |
| S5 | 5 | 55 | Nd:40 | 13 | 54 | 2200 | +20 |
| S6 | 20 | 60 | Nd:20 | 13 | 105 | 3500 | −100 |
| S7 | 10 | 75 | Nd:15 | 13 | 72 | 3000 | −120 |
| S8 | 2 | 65 | Nd:33 | 13 | 50 | 2500 | +10 |
| S9 | 10 | 50 | Nd:40 | 13 | 47 | 2400 | +50 |
| S10 | 10 | 63 | Nd:27 | 0 | 65 | 3500 | +30 |
| S11 | 10 | 63 | Nd:27 | 3 | 80 | 4000 | +30 |
| S12 | 10 | 63 | Nd:27 | 20 | 100 | 5000 | −30 |
| S13 | 10 | 63 | Nd:27 | 25 | 90 | 900 | −100 |
| S14 | 13 | 65 | Nd:27 | 0 | 69 | 3400 | −20 |
| S15 | 13 | 60 | Nd:27 | 0 | 60 | 3600 | +20 |
| S16 | 20 | 60 | Nd:20 | 0 | 75 | 2000 | −100 |
| S17 | 2 | 65 | Nd:33 | 0 | 35 | 2500 | +40 |
| S18 | 10 | 63 | La:27 | 13 | 100 | 4000 | −20 |
| S19 | 10 | 63 | Pr:27 | 13 | 97 | 4500 | −15 |
| S20 | 10 | 63 | Sm:27 | 13 | 92 | 5000 | 0 |
| S21 | 10 | 63 | 27 (La/Nd = 0.5/0.5) | 13 | 97 | 5000 | −10 |

TABLE 1-continued

| First ceramic composition No. | Primary component (mole %) | | | Secondary component (parts by weight) PbO | Relative dielectric constant (εr) | Q value | Temperature coefficient of dielectric constant (ppm/° C.) |
|---|---|---|---|---|---|---|---|
| | BaO | TiO$_2$ | REO$_{3/2}$ | | | | |
| S22 | 10 | 63 | 27 (Pr/Nd = 0.25/0.75) | 13 | 96 | 5000 | −10 |
| S23 | 13 | 65 | 22 (Pr/Nd = 0.25/0.75) | 13 | 101 | 4000 | −10 |
| S24 | 13 | 65 | 22 (Pr/Nd = 0.5/0.5) | 13 | 100 | 4500 | −5 |
| S25 | 10 | 63 | 27 (Sm/Nd = 0.5/0.5) | 13 | 94 | 5000 | −5 |
| S26 | 10 | 45 | Nd:45 | 13 | 43 | 2000 | +60 |
| S27 | 10 | 63 | 27 (Pr/Nd = 0.5/0.5) | 13 | 100 | 4500 | −5 |

Production of Glass Compositions $B_2O_3$, $SiO_2$, BaO, SrO, CaO, MgO and $Li_2O$ were weighed and thoroughly mixed together to obtain mixtures having compositional ratios indicated in Table 2. Each of the mixtures was melted at 1100–1400° C., quenched by pouring into water, and then wet-milled to thereby obtain glass compositions G1 through G31.

To each of the thus-obtained first ceramic compositions S1 through S25, a glass composition selected from G1 through G31 was added so as to produce mixtures having compositional ratios indicated in Tables 3 to 5. To each of the mixtures, CuO powder serving as a secondary component was added so as to produce mixtures having composi-

TABLE 2

| Glass composition No. | Alkaline earth metal oxide RO | | | | | $B_2O_3$ (wt %) | $SiO_2$ (wt %) | $Li_2O$ (wt %) |
|---|---|---|---|---|---|---|---|---|
| | Total amount of RO | Proportions of respective components in RO | | | | | | |
| | | BaO | SrO | CaO | MgO | | | |
| G1 | 61 | 82 | 11 | 5 | 2 | 14 | 23 | 2 |
| G2 | 30 | 82 | 11 | 5 | 2 | 29 | 39 | 2 |
| G3 | 40 | 82 | 11 | 5 | 2 | 25 | 33 | 2 |
| G4 | 80 | 82 | 11 | 5 | 2 | 5 | 13 | 2 |
| G5 | 90 | 82 | 11 | 5 | 2 | 3 | 5 | 2 |
| G6 | 67 | 82 | 11 | 5 | 2 | 1 | 30 | 2 |
| G7 | 66 | 82 | 11 | 5 | 2 | 3 | 29 | 2 |
| G8 | 50 | 82 | 11 | 5 | 2 | 30 | 18 | 2 |
| G9 | 44 | 82 | 11 | 5 | 2 | 40 | 14 | 2 |
| G10 | 70 | 82 | 11 | 5 | 2 | 20 | 8 | 2 |
| G11 | 68 | 82 | 11 | 5 | 2 | 17 | 13 | 2 |
| G12 | 40 | 82 | 11 | 5 | 2 | 8 | 50 | 2 |
| G13 | 30 | 82 | 11 | 5 | 2 | 8 | 60 | 2 |
| G14 | 63 | 82 | 11 | 5 | 2 | 14 | 23 | 0 |
| G15 | 62.5 | 82 | 11 | 5 | 2 | 14 | 23 | 0.5 |
| G16 | 62 | 82 | 11 | 5 | 2 | 14 | 23 | 1 |
| G17 | 57 | 82 | 11 | 5 | 2 | 12 | 21 | 10 |
| G18 | 55 | 82 | 11 | 5 | 2 | 11 | 19 | 15 |
| G19 | 61 | 30 | 35 | 25 | 10 | 14 | 23 | 2 |
| G20 | 61 | 40 | 33 | 24 | 3 | 14 | 23 | 2 |
| G21 | 61 | 96 | 2 | 2 | 1 | 14 | 23 | 2 |
| G22 | 61 | 100 | 0 | 0 | 0 | 14 | 23 | 2 |
| G23 | 61 | 85 | 0 | 13 | 2 | 14 | 23 | 2 |
| G24 | 61 | 45 | 35 | 18 | 2 | 14 | 23 | 2 |
| G25 | 61 | 40 | 45 | 13 | 2 | 14 | 23 | 2 |
| G26 | 61 | 85 | 13 | 0 | 2 | 14 | 23 | 2 |
| G27 | 61 | 50 | 12 | 35 | 2 | 14 | 23 | 2 |
| G28 | 61 | 40 | 13 | 45 | 2 | 14 | 23 | 2 |
| G29 | 61 | 83 | 12 | 5 | 0 | 14 | 23 | 2 |
| G30 | 61 | 60 | 15 | 5 | 20 | 14 | 23 | 2 |
| G31 | 61 | 55 | 15 | 5 | 25 | 14 | 23 | 2 |

Production of Dielectric Ceramic Compositions

Dielectric ceramic compositions comprising a mixture of a first ceramic composition and a glass composition (and CuO) were prepared and then evaluated.

tional proportions indicated in Tables 3 to 5, which were then mixed thoroughly. To the raw mixtures, appropriate amounts of a binder, a plasticizer, and a solvent were added, and the mixtures were kneaded to provide slurries.

Each of the thus-obtained slurries was molded, through a doctor blade coating method, into a sheet having a thickness of 50 μm, and the produced ceramic green sheet was cut into pieces having a size of 30 mm×10 mm. The pieces were laminated and pressed to form a sheet having a thickness of 0.5 mm. Plate-like dielectric ceramics of sample Nos. 1 to 67 listed in Tables 3 to 5 were obtained by firing the corresponding pressed sheets in $N_2$ at 1000° C. for one hour.

The dielectric ceramics obtained as above were subjected to measurement of relative dielectric constant (εr), Q value, and temperature coefficient of change in dielectric constant (ppm/° C.). The relative dielectric constant was measured at a frequency of 1 MHz. The results of measurement are shown in Tables 3 to 5.

TABLE 3

| Sample No. | First ceramic composition No. | First ceramic composition Amount (wt %) | Glass composition No. | Glass composition Amount (wt %) | CuO content (wt %) | Firing temperature (° C.) | Relative dielectric constant (εr) | Q value | Temperature coefficient of dielectric constant (ppm/° C.) | Remarks |
|---|---|---|---|---|---|---|---|---|---|---|
| 1 | S1 | 90 | G1 | 10 | 0 | 1000 | 60 | 2500 | 0 | |
| 2 | S1 | 90 | G4 | 10 | 0 | 1000 | 62 | 2000 | −20 | |
| 3 | S1 | 88 | G4 | 12 | 0 | 1000 | 63 | 2000 | −30 | |
| *4 | S1 | 88.5 | G2 | 10 | 1.5 | 1000 | — | — | — | Not sintered |
| 5 | S1 | 88.5 | G3 | 10 | 1.5 | 1000 | 65 | 4000 | −20 | |
| 6 | S1 | 88.5 | G4 | 10 | 1.5 | 1000 | 77 | 3500 | −30 | |
| *7 | S1 | 88.5 | G5 | 10 | 1.5 | 1000 | 78 | 3000 | −40 | Poor moisture resistance |
| *8 | S1 | 88.5 | G6 | 10 | 1.5 | 1000 | — | — | — | Not sintered |
| 9 | S1 | 88.5 | G7 | 10 | 1.5 | 1000 | 70 | 4500 | −10 | |
| 10 | S1 | 88.5 | G8 | 10 | 1.5 | 1000 | 75 | 3000 | −15 | |
| *11 | S1 | 88.5 | G9 | 10 | 1.5 | 1000 | 75 | 3000 | −30 | Poor moisture resistance |
| *12 | S1 | 88.5 | G10 | 10 | 1.5 | 1000 | 80 | 2500 | −20 | Poor moisture resistance |
| 13 | S1 | 88.5 | G11 | 10 | 1.5 | 1000 | 77 | 3000 | −15 | |
| 14 | S1 | 88.5 | G12 | 10 | 1.5 | 1000 | 73 | 3500 | −5 | |
| *15 | S1 | 88.5 | G13 | 10 | 1.5 | 1000 | — | — | — | Not sintered |
| *16 | S1 | 88.5 | G14 | 10 | 1.5 | 1000 | — | — | — | Not sintered |
| 17 | S1 | 88.5 | G15 | 10 | 1.5 | 1000 | 70 | 2500 | +10 | |
| 18 | S1 | 88.5 | G16 | 10 | 1.5 | 1000 | 72 | 4500 | 0 | |
| 19 | S1 | 88.5 | G17 | 10 | 1.5 | 1000 | 77 | 3000 | −30 | |
| *20 | S1 | 88.5 | G18 | 10 | 1.5 | 1000 | 78 | 2500 | −30 | Poor moisture resistance |
| 21 | S14 | 88.5 | G1 | 10 | 1.5 | 1000 | 53 | 3000 | −25 | |
| 22 | S15 | 88.5 | G1 | 10 | 1.5 | 1000 | 48 | 3100 | +15 | |
| 23 | S16 | 88.5 | G1 | 10 | 1.5 | 1000 | 60 | 1700 | −120 | |
| 24 | S17 | 88.5 | G1 | 10 | 1.5 | 1000 | 27 | 150 | +35 | |

* = Outside the scope of the invention

TABLE 4

| Sample No. | First Ceramic Composition No. | First Ceramic Composition Amount (wt %) | Glass Composition No. | Glass Composition Amount (wt %) | CuO Content (wt %) | Firing Temperature (° C.) | Q Value | Relative Dielectric Constant (εr) | Temperature Coefficient of Dielectric Constant (ppm/° C.) | Remarks |
|---|---|---|---|---|---|---|---|---|---|---|
| 25 | S1 | 88.5 | G1 | 10 | 1.5 | 1000 | 75 | 4000 | −10 | |
| 26 | S2 | 88.5 | G1 | 10 | 1.5 | 1000 | 65 | 2000 | −50 | |
| 27 | S3 | 88.5 | G1 | 10 | 1.5 | 1000 | 60 | 2300 | −70 | |
| 28 | S4 | 88.5 | G1 | 10 | 1.5 | 1000 | 55 | 3000 | −70 | |
| 29 | S5 | 88.5 | G1 | 10 | 1.5 | 1000 | 50 | 2000 | 0 | |
| 30 | S6 | 88.5 | G1 | 10 | 1.5 | 1000 | 80 | 2500 | −120 | |
| 31 | S7 | 88.5 | G1 | 10 | 1.5 | 1000 | 55 | 2000 | −150 | |
| 32 | S8 | 88.5 | G1 | 10 | 1.5 | 1000 | 35 | 1500 | −10 | |
| 33 | S9 | 88.5 | G1 | 10 | 1.5 | 1000 | 30 | 1500 | +20 | |
| 34 | S10 | 88.5 | G1 | 10 | 1.5 | 1000 | 50 | 3000 | 0 | |
| 35 | S11 | 88.5 | G1 | 10 | 1.5 | 1000 | 65 | 4000 | +10 | |
| 36 | S12 | 88.5 | G1 | 10 | 1.5 | 1000 | 80 | 2000 | −20 | |
| 37 | S13 | 88.5 | G1 | 10 | 1.5 | 1000 | 70 | 1000 | −150 | |
| 38 | S1 | 88.5 | G19 | 10 | 1.5 | 1000 | — | — | — | Insufficiently sintered |
| 39 | S1 | 88.5 | G20 | 10 | 1.5 | 1000 | 67 | 4000 | +10 | |
| 40 | S1 | 88.5 | G21 | 10 | 1.5 | 1000 | 77 | 4000 | −20 | |
| 41 | S1 | 88.5 | G22 | 10 | 1.5 | 1000 | 78 | 3700 | −25 | Poor moisture resistance |

TABLE 4-continued

| Sample No. | First Ceramic Composition No. | First Ceramic Composition Amount (wt %) | Glass Composition No. | Glass Composition Amount (wt %) | CuO Content (wt %) | Firing Temperature (° C.) | Q Value | Relative Dielectric Constant ($\epsilon r$) | Temperature Coefficient of Dielectric Constant (ppm/° C.) | Remarks |
|---|---|---|---|---|---|---|---|---|---|---|
| 42 | S1 | 88.5 | G23 | 10 | 1.5 | 1000 | 76 | 4000 | −15 | |
| 43 | S1 | 88.5 | G24 | 10 | 1.5 | 1000 | 67 | 3500 | +5 | |
| 44 | S1 | 88.5 | G25 | 10 | 1.5 | 1000 | — | — | — | Insufficiently sintered |
| 45 | S1 | 88.5 | G26 | 10 | 1.5 | 1000 | 75 | 4200 | −10 | |
| 46 | S1 | 88.5 | G27 | 10 | 1.5 | 1000 | 65 | 4000 | +10 | |
| 47 | S1 | 88.5 | G28 | 10 | 1.5 | 1000 | — | — | — | Insufficiently sintered |
| 48 | S1 | 88.5 | G29 | 10 | 1.5 | 1000 | 77 | 4000 | −5 | |
| 49 | S1 | 88.5 | G30 | 10 | 1.5 | 1000 | 60 | 4000 | −10 | |
| 50 | S1 | 88.5 | G31 | 10 | 1.5 | 1000 | — | — | — | Insufficiently sintered |

TABLE 5

| Sample No. | First Ceramic Composition No. | First Ceramic Composition Amount (wt %) | Glass Composition No. | Glass Composition Amount (wt %) | CuO Content (wt %) | Firing Temperature | Q Value | Relative Dielectric Constant ($\epsilon r$) | Temperature Coefficient of Dielectric Constant (ppm/° C.) | Remarks |
|---|---|---|---|---|---|---|---|---|---|---|
| 51 | S1 | 89.8 | G1 | 10 | 0.2 | 1000 | 70 | 4000 | −5 | |
| 52 | S1 | 87 | G1 | 10 | 3.0 | 1000 | 78 | 3000 | −20 | |
| 53 | S1 | 87 | G1 | 10 | 5.0 | 1000 | 85 | 100 | +200 | |
| 54 | S1 | 95.5 | G1 | 3 | 1.5 | 1000 | — | — | — | Insufficiently sintered |
| 55 | S1 | 93.5 | G1 | 5 | 1.5 | 1000 | 70 | 5000 | −10 | |
| 56 | S1 | 78.5 | G1 | 20 | 1.5 | 1000 | 50 | 1500 | +20 | |
| 57 | S1 | 68.5 | G1 | 30 | 1.5 | 1000 | 40 | 800 | +40 | Poor moisture resistance |
| 58 | S1 | 87.5 | G12 | 12 | 0.5 | 1000 | 64 | 4000 | −10 | |
| 59 | S1 | 88.5 | G16 | 12 | 1.0 | 1000 | 70 | 3000 | −20 | |
| 60 | S18 | 88.5 | G1 | 10 | 1.5 | 1000 | 78 | 3500 | −30 | |
| 61 | S19 | 88.5 | G1 | 10 | 1.5 | 1000 | 76 | 4000 | −20 | |
| 62 | S20 | 88.5 | G1 | 10 | 1.5 | 1000 | 73 | 4500 | −5 | |
| 63 | S21 | 88.5 | G1 | 10 | 1.5 | 1000 | 76 | 4500 | −20 | |
| 64 | S22 | 88.5 | G1 | 10 | 1.5 | 1000 | 75 | 4500 | −25 | |
| 65 | S23 | 88.5 | G1 | 10 | 1.5 | 1000 | 80 | 3500 | −20 | |
| 66 | S24 | 88.5 | G1 | 10 | 1.5 | 1000 | 79 | 4000 | −15 | |
| 67 | S25 | 88.5 | G1 | 10 | 1.5 | 1000 | 74 | 4000 | −10 | |

As is apparent from Tables 3, 4, and 5, dielectric ceramic compositions formed of a mixture comprising a first BaO—TiO$_2$—REO$_{3/2}$ ceramic composition wherein RE represents a rare earth element and a glass composition which comprises about 13–50 wt. % SiO$_2$, about 3–30 wt. % B$_2$O$_3$, about 40–80 wt. % alkaline earth metal oxide and about 0.5–10 wt. % Li$_2$O have excellent characteristics; i.e., a high relative dielectric constant, a high Q value and a low temperature coefficient of change in dielectric constant, as shown for sample Nos. 1 to 3. Furthermore, the dielectric compositions are obtained by firing at about 1000° C. or less.

Compositions further containing CuO serving as a secondary component have excellent characteristics; i.e., a high relative dielectric constant, a high Q value and a low temperature coefficient of change in dielectric constant, as shown for sample Nos. 5, 6, 9, 10, 13, 14, 17 to 19 and 21 to 24. Furthermore, more stable dielectric ceramic compositions are obtained by firing at about 1000° C. or less. Briefly, incorporation of CuO enhances Q value and relative dielectric constant as shown in comparison between sample No. 1 and sample Nos. 51 to 53, and, although data are not shown, can lower the sintering temperature.

In contrast, as shown in sample Nos. 4, 7, 8, 11, 12, 15, 16 and 20, the dielectric ceramic compositions having a composition falling outside the above-described compositional ranges are not sintered at 1000° C. or are sintered insufficiently, to yield poor moisture resistance.

As shown in sample Nos. 25 to 29, 35, and 36, dielectric ceramic compositions having a lower temperature coefficient of change in dielectric constant are obtained by designating the compositional ranges of the first BaO—TiO$_2$—REO$_{3/2}$ ceramic compositions as xBaO—yTiO$_2$—zREO$_{3/2}$, wherein x, y, and z are each based on mole % and are represented by $5 \leq x \leq 15$, $52.5 \leq y \leq 70$, and $15 \leq z \leq 42.5$; and x+y+z=100, and incorporating about 20 parts by weight or less of PbO to 100 parts by weight of the corresponding first ceramic compositions.

Preferably, the alkaline earth metal oxide contained in the glass compositions comprises BaO and at least one species selected from the group consisting of SrO, CaO and MgO, and the compositional ratio thereof lies within the following ranges: about 35 wt. % or less for SrO, about 35 wt. % or less for CaO, about 20 wt. % or less for MgO and about 40–95 wt. % for BaO, as shown in sample Nos. 39, 40, 42, 43, 45, 46, 48 and 49.

Preferably, the proportions of the first ceramic composition, glass composition, and CuO are respectively about 80–95 wt. %, about 5–20 wt. % and about 3 wt. % or less, as shown in sample Nos. 51, 52, 55, 58 and 59. CuO serving as a secondary component may be incorporated by adding CuO powder into a mixture of the first ceramic composition and the glass composition as shown in the above examples, as well as by mixing a glass composition containing CuO prepared in advance and the ceramic composition. In either case, the same effect can be obtained.

Moreover, as shown in sample Nos. 60 to 67, dielectric ceramic compositions having excellent characteristics, i.e., a high relative dielectric constant, a high Q value and a low temperature coefficient of change in dielectric constant, are produced by firing at about 1000° C. or less, when La, Pr, or Sm rather than Nd is used as RE, i.e., the rare earth element of the $BaO$—$TiO_2$—$REO_{3/2}$ ceramic composition. Therefore, examples of rare earth elements RE, which may be used singly or in combination, include Sc, Y, La, Ce, Pr, Nd, Pm, Sm, Eu, Gd, Tb, Dy, Ho, Er, Tm, Yb and Lu.

Dielectric ceramic compositions comprising a mixture of a first ceramic composition, a glass composition and a second dielectric ceramic composition (and CuO) were prepared, then evaluated.

An appropriate amount of CuO powder was added to the first ceramic compositions shown in Table 1 and the glass compositions shown in Table 2.

To each of the thus-obtained mixtures, $TiO_2$, $CaTiO_3$, $SrTiO_3$ or $Nd_2Ti_2O_7$ serving as a second ceramic composition were then added so as to produce mixtures having compositional proportions indicated in Tables 6 to 11, which were then mixed thoroughly. To the raw mixtures, an appropriate amount of an organic vehicle such as a binder, a plasticizer and a solvent were added, and the mixtures were kneaded to provide slurries.

Each of the thus-obtained slurries was molded, through a doctor blade coating method, into a sheet having a thickness of 50 μm, and the produced ceramic green sheet was cut into pieces having a size of 30 mm×10 mm. The pieces were laminated and pressed to form a sheet having a thickness of 0.5 mm. Dielectric ceramics of samples Nos. 68 to 132 listed in Tables 6 to 11 were obtained by firing the corresponding pressed sheets in air at 1000° C. or less for one hour.

The dielectric ceramics obtained as above were subjected to measurement of relative dielectric constant (εr), Q value and temperature coefficient of change in dielectric constant (ppm/° C.). The relative dielectric constant was measured at a frequency of 1 MHz. The results of measurement are shown in Tables 6 to 11.

TABLE 6A

| Sample No. | First Ceramic Composition No. | First Ceramic Composition Amount (wt %) | Glass Composition No. | Glass Composition Amount (wt %) | Second Ceramic Composition Species | Second Ceramic Composition Amount (wt %) | CuO (wt %) |
|---|---|---|---|---|---|---|---|
| 68 | S1 | 95.5 | G1 | 10 | $TiO_2$ | 0.5 | 1.5 |
| 69 | S1 | 94.0 | G1 | 10 | $TiO_2$ | 0.5 | 1.5 |
| 70 | S1 | 68.5 | G1 | 10 | $TiO_2$ | 10 | 1.5 |
| 71 | S1 | 58.5 | G1 | 10 | $TiO_2$ | 10 | 1.5 |
| 72 | S1 | 80 | G1 | 10 | $TiO_2$ | 10 | 1.5 |
| 73 | S1 | 77.0 | G1 | 10 | $TiO_2$ | 10 | 1.5 |
| 74 | S1 | 75.0 | G1 | 10 | $TiO_2$ | 10 | 1.5 |
| 75 | S1 | 86.5 | G1 | 10 | $TiO_2$ | 2 | 1.5 |
| 76 | S1 | 78.5 | G1 | 10 | $TiO_2$ | 10 | 1.5 |
| 77 | S1 | 58.5 | G1 | 10 | $TiO_2$ | 30 | 1.5 |
| 78 | S1 | 48.5 | G1 | 10 | $TiO_2$ | 40 | 1.5 |
| 79 | S1 | 86.5 | G1 | 10 | $CaTiO_3$ | 2 | 1.5 |
| 80 | S1 | 58.5 | G1 | 10 | $CaTiO_3$ | 30 | 1.5 |
| 81 | S1 | 48.5 | G1 | 10 | $CaTiO_3$ | 40 | 1.5 |
| 82 | S1 | 86.5 | G1 | 10 | $SrTiO_3$ | 2 | 1.5 |
| 83 | S1 | 58.5 | G1 | 10 | $SrTiO_3$ | 30 | 1.5 |
| 84 | S1 | 48.5 | G1 | 10 | $SrTiO_3$ | 40 | 1.5 |
| 85 | S1 | 78.5 | G1 | 10 | $SrTiO_3/TiO_2$ | 5/5 | 1.5 |
| 86 | S1 | 48.5 | G1 | 10 | $SrTiO_3/TiO_2$ | 20/20 | 1.5 |
| 87 | S1 | 83.5 | G1 | 10 | $Nd_2Ti_2O_7$ | 5 | 1.5 |

TABLE 6B

| Sample No. | First Ceramic Composition No. | First Ceramic Composition Amount (wt %) | Glass Composition No. | Glass Composition Amount (wt %) | Second Ceramic Composition Species | Second Ceramic Composition Amount (wt %) | CuO (wt %) |
|---|---|---|---|---|---|---|---|
| 88 | S1 | 78.5 | G1 | 10 | $Nd_2Ti_2O_7$ | 10 | 1.5 |
| 89 | S1 | 58.5 | G1 | 10 | $Nd_2Ti_2O_7$ | 30 | 1.5 |
| 90 | S1 | 48.5 | G1 | 10 | $Nd_2Ti_2O_7$ | 40 | 1.5 |
| 91 | S1 | 58.5 | G1 | 10 | $TiO_2$ | 30 | 1.5 |
| 92 | S1 | 48.5 | G1 | 10 | $TiO_2$ | 40 | 1.5 |
| 93 | S1 | 86.5 | G1 | 10 | $CaTiO_2$ | 2 | 1.5 |
| 94 | S1 | 58.5 | G1 | 10 | $CaTiO_2$ | 30 | 1.5 |
| 95 | S1 | 48.5 | G1 | 10 | $CaTiO_2$ | 40 | 1.5 |
| 96 | S1 | 86.5 | G1 | 10 | $SrTiO_3$ | 2 | 1.5 |
| 97 | S1 | 58.5 | G1 | 10 | $SrTiO_3$ | 30 | 1.5 |
| 98 | S1 | 48.5 | G1 | 10 | $SrTiO_3$ | 40 | 1.5 |
| 99 | S1 | 78.5 | G1 | 10 | $SrTiO_3/TiO_2$ | 5/5 | 1.5 |
| 100 | S1 | 48.5 | G1 | 10 | $SrTiO_3/TiO_2$ | 20/20 | 1.5 |
| 101 | S1 | 83.5 | G1 | 10 | $Nd_2Ti_2O_7$ | 5 | 1.5 |
| 102 | S1 | 78.5 | | | $Nd_2Ti_2O_7$ | 10 | |
| 103 | S1 | 58.5 | | | $Nd_2Ti_2O_7$ | 30 | |
| 104 | S1 | 48.5 | G1 | 10 | $Nd_2Ti_2O_7$ | 40 | 1.5 |

TABLE 7A

| Sample No. | Firing Temperature (° C.) | Relative Dielectric Constant (εr) | Q Value | Temperature Coefficient of Dielectric Constant (ppm/° C.) | Remarks |
|---|---|---|---|---|---|
| 68 | 1000 | — | — | — | Insufficiently sintered |
| 69 | 1000 | 83 | 5000 | −60 | |
| 70 | 1000 | 53 | 1600 | −80 | |
| 71 | 1000 | 45 | 1000 | −60 | Low ε |
| 72 | 1000 | 75 | 2800 | −50 | |
| 73 | 1000 | 80 | 3500 | −60 | |
| 74 | 1000 | 110 | 200 | +150 | Low Q Value |
| 75 | 1000 | 76 | 4000 | −20 | |
| 76 | 1000 | 78 | 4100 | −50 | |
| 77 | 1000 | 86 | 2700 | −120 | |
| 78 | 1000 | — | — | — | Insufficiently sintered |
| 79 | 1000 | 78 | 3800 | −30 | |
| 80 | 1000 | 90 | 2500 | −180 | |
| 81 | 1000 | — | — | — | Insufficiently sintered |
| 82 | 1000 | 79 | 3500 | −40 | |
| 83 | 1000 | 120 | 2000 | −250 | |
| 84 | 1000 | — | — | — | Insufficiently sintered |

TABLE 7A-continued

| Sample No. | Firing Temperature (° C.) | Relative Dielectric Constant (εr) | Q Value | Temperature Coefficient of Dielectric Constant (ppm/° C.) | Remarks |
|---|---|---|---|---|---|
| 85 | 1000 | 95 | 2500 | 100 | |
| 86 | 1000 | — | — | — | Insufficiently sintered |
| 87 | 1000 | 73 | 3500 | 0 | |

TABLE 7B

| Sample No. | Firing Temperature (° C.) | Relative Dielectric Constant (εr) | Q Value | Temperature Coefficient of Dielectric Constant (ppm/° C.) | Remarks |
|---|---|---|---|---|---|
| 88 | 1000 | 71 | 3000 | +10 | |
| 89 | 1000 | 62 | 2000 | +30 | |
| 90 | 1000 | — | — | — | Insufficiently sintered |
| 91 | 1000 | 86 | 2700 | −120 | |
| 92 | 1000 | — | — | — | Insufficiently sintered |
| 93 | 1000 | 78 | 3800 | −30 | |
| 94 | 1000 | 90 | 2500 | −180 | |
| 95 | 1000 | — | — | — | Insufficiently sintered |
| 96 | 1000 | 79 | 3500 | −40 | |
| 97 | 1000 | 120 | 2000 | −250 | |
| 98 | 1000 | — | — | — | Insufficiently sintered |
| 99 | 1000 | 95 | 2500 | −100 | |
| 100 | 1000 | — | — | — | Insufficiently sintered |
| 101 | 1000 | 73 | 3500 | 0 | |
| 102 | 1000 | 71 | 3000 | +10 | |
| 103 | 1000 | 62 | 2000 | +30 | |
| 104 | 1000 | — | — | — | Insufficiently sintered |

TABLE 8

| Sample No. | First Ceramic Composition No. | Amount (wt %) | Glass Composition No. | Amount (wt %) | Second Ceramic Composition Species | Amount (wt %) | CuO (wt %) |
|---|---|---|---|---|---|---|---|
| 105 | S2 | 78.5 | G1 | 10 | TiO$_2$ | 10 | 1.5 |
| 106 | S3 | 78.5 | G1 | 10 | TiO$_2$ | 10 | 1.5 |
| 107 | S4 | 78.5 | G1 | 10 | TiO$_2$ | 10 | 1.5 |
| 108 | S5 | 78.5 | G1 | 10 | TiO$_2$ | 10 | 1.5 |
| 109 | S6 | 78.5 | G1 | 10 | TiO$_2$ | 10 | 1.5 |
| 110 | S7 | 78.5 | G1 | 10 | TiO$_2$ | 10 | 1.5 |
| 111 | S8 | 78.5 | G1 | 10 | TiO$_2$ | 10 | 1.5 |
| 112 | S26 | 78.5 | G1 | 10 | TiO$_2$ | 10 | 1.5 |
| 113 | S10 | 78.5 | G1 | 10 | TiO$_2$ | 10 | 1.5 |
| 114 | S11 | 78.5 | G1 | 10 | TiO$_2$ | 10 | 1.5 |
| 115 | S12 | 78.5 | G1 | 10 | TiO$_2$ | 10 | 1.5 |
| 116 | S13 | 78.5 | G1 | 10 | TiO$_2$ | 10 | 1.5 |
| 117 | S19 | 78.5 | G1 | 10 | TiO$_2$ | 10 | 1.5 |
| 118 | S20 | 78.5 | G1 | 10 | TiO$_2$ | 10 | 1.5 |
| 119 | S27 | 78.5 | G1 | 10 | TiO$_2$ | 10 | 1.5 |

TABLE 9

| Sample No. | Firing temperature (° C.) | Relative Dielectric Constant (εr) | Q value | Temperature Coefficient of Dielectric Constant (ppm/° C.) | Remarks |
|---|---|---|---|---|---|
| 105 | 1000 | 68 | 1500 | −120 | |
| 106 | 1000 | 64 | 2000 | −150 | |
| 107 | 1000 | 53 | 2800 | −120 | |
| 108 | 1000 | 45 | 1200 | −30 | |
| 109 | 1000 | 90 | 2500 | −160 | |
| 110 | 1000 | 58 | 2000 | −180 | |
| 111 | 1000 | 37 | 900 | −40 | Low Q value |
| 112 | 1000 | 30 | 900 | 0 | Low Q value |
| 113 | 1000 | 50 | 2500 | −10 | |
| 114 | 1000 | 65 | 2800 | 0 | |
| 115 | 1000 | 85 | 3000 | −75 | |
| 116 | 1000 | 75 | 500 | −150 | Low Q value |
| 117 | 1000 | 80 | 3500 | −60 | |
| 118 | 1000 | 75 | 3800 | −40 | |
| 119 | 1000 | 82 | 3500 | −45 | |

TABLE 10

| Sample No. | First ceramic composition No. | Amount (wt %) | Glass composition No. | Amount (wt %) | Second ceramic composition Species | Amount (wt %) | CuO (wt %) |
|---|---|---|---|---|---|---|---|
| 120 | S1 | 78.5 | G2 | 10 | TiO$_2$ | 10 | 1.5 |
| 121 | S1 | 78.5 | G3 | 10 | TiO$_2$ | 10 | 1.5 |
| 122 | S1 | 78.5 | G4 | 10 | TiO$_2$ | 10 | 1.5 |
| 123 | S1 | 78.5 | G5 | 10 | TiO$_2$ | 10 | 1.5 |
| 134 | S1 | 78.5 | G6 | 10 | TiO$_2$ | 10 | 1.5 |
| 125 | S1 | 78.5 | G8 | 10 | TiO$_2$ | 10 | 1.5 |
| 126 | S1 | 78.5 | G9 | 10 | TiO$_2$ | 10 | 1.5 |
| 127 | S1 | 78.5 | G12 | 10 | TiO$_2$ | 10 | 1.5 |
| 128 | S1 | 78.5 | G13 | 10 | TiO$_2$ | 10 | 1.5 |
| 129 | S1 | 78.5 | G14 | 10 | TiO$_2$ | 10 | 1.5 |
| 130 | S1 | 78.5 | G15 | 10 | TiO$_2$ | 10 | 1.5 |
| 131 | S1 | 78.5 | G17 | 10 | TiO$_2$ | 10 | 1.5 |
| 132 | S1 | 78.5 | G18 | 10 | TiO$_2$ | 10 | 1.5 |

TABLE 11

| Sample No. | Firing temperature (° C.) | Relative dielectric constant (εr) | Q value | Temperature coefficient of dielectric constant (ppm/° C.) | Remarks |
|---|---|---|---|---|---|
| 120 | 1000 | — | — | — | Not sintered |
| 121 | 1000 | 75 | 3500 | −50 | |
| 122 | 1000 | 80 | 3700 | −53 | |
| 123 | 1000 | 81 | 3800 | −54 | Moisture resistance: Not good |
| 124 | 1000 | — | — | — | Not sintered |
| 125 | 1000 | 80 | 3700 | −50 | |
| 126 | 1000 | 81 | 3800 | −52 | Moisture resistance: Not good |
| 127 | 1000 | 73 | 3300 | −45 | |
| 128 | 1000 | — | — | — | Not sintered |
| 129 | 1000 | — | — | — | Not sintered |
| 130 | 1000 | 70 | 2500 | −40 | |
| 131 | 1000 | 81 | 2000 | −50 | |
| 132 | 1000 | 82 | 1700 | −54 | Moisture resistance: Not good |

As is apparent from Tables 6 to 11, the temperature characteristics of the dielectric ceramic compositions can be preset to desired values more effectively by incorporating at least one species of a second ceramic composition selected from the group consisting of $TiO_2$, $CaTiO_3$, $SrTiO_3$ and $Nd_2Ti_2O_7$ into a dielectric ceramic composition comprising a mixture of a first $BaO-TiO_2-REO_{3/2}$ ceramic composition (wherein RE represents a rare earth element) and a glass composition, wherein the glass composition comprises about 13–50 wt. % $SiO_2$, about 3–30 wt. % $B_2O_3$, about 40–80 wt. % alkaline earth metal oxide and about 0.5–10 wt. % $Li_2O$. Briefly, target temperature characteristics of the dielectric compositions can be realized through incorporation of $TiO_2$, $CaTiO_3$ and $SrTiO_3$ having a negative temperature coefficient of dielectric constant or $Nd_2Ti_2O_7$ having a positive temperature coefficient thereof as secondary components.

contrast, as in the case of sample No. 120, a dielectric composition containing a lower amount of an alkaline earth metal oxide in the glass composition cannot be sintered at 1000° C.; whereas, as in the case of sample No. 123, a dielectric composition containing a higher amount of an alkaline earth metal oxide and a lower amount of $SiO_2$ has unsatisfactory moisture resistance. As in the case of sample No. 124, a dielectric composition containing a lower amount of $B_2O_3$ in the glass composition cannot be sintered at 1000° C., whereas, as in the case of sample No. 126, a dielectric composition containing a higher amount of $B_2O_3$ has unsatisfactory moisture resistance. Moreover, as in the case of sample No. 128, a dielectric composition having a lower content ratio of an alkaline earth metal oxide and a higher content ratio of $SiO_2$ in the glass composition cannot be sintered at 1000° C.; whereas, as in the case of sample No. 129, a dielectric composition not containing a predetermined amount of $Li_2O$ in the glass composition cannot be sintered and a dielectric ceramic composition containing an excessive amount of $Li_2O$ has unsatisfactory moisture resistance as in the case of sample No. 132.

As in the case of sample No. 68, the sintered property of a dielectric ceramic composition having a higher content ratio of the first ceramic composition and having a lower content ratio of the glass composition tends to deteriorate; whereas as in the case of sample No. 71, the dielectric constant of a dielectric ceramic composition having a higher content ratio of glass composition tends to decrease. As in the case of sample No. 74, the Q value of a dielectric ceramic composition having a higher content ratio of CuO in the glass composition tends to decrease.

As in the case of sample Nos. 81, 84, 86, 90, 92, 95, 98, 100 and 104, the sintered property of a dielectric ceramic composition having a lower content ratio of the first ceramic composition and a higher content ratio of the second ceramic composition tends to deteriorate.

Furthermore, as indicated in the case of sample Nos. 109 and 110, a dielectric ceramic composition having a compositional range of the first ceramic composition falling within the domain A or the domain B indicated in FIG. 1 tends to have a greater temperature coefficient. Although examples are not shown here, when the range falls within the domain A, sintering of a ceramic composition tends be difficult and a porous ceramic might be produced. As in the case of sample Nos. 111 and 112, when a compositional range of the first ceramic composition falls in the domain C and the domain D indicated in FIG. 1, the relative dielectric constant tends to decrease. When the PbO content in the first ceramic composition is excessively high, as indicated in sample No. 116, the relative dielectric constant tends to decrease.

In the above Tables, the term "not sintered" denotes that firing at a predetermined temperature can never be performed, and the term "insufficiently sintered" denotes that firing is completed insufficiently under the above conditions and may be possible by modifying the conditions. The term "poor moisture resistance" refers to moisture resistance of a dielectric ceramic composition causing fatal problems and the term "insufficient moisture resistance" refers to moisture resistance that may be insufficient depending on conditions.

As described herein above, the present invention provides a dielectric ceramic composition which is sintered at a temperature lower than the melting point of an electric conductor containing, as a primary component, a low specific-resistance metal selected from gold, silver and copper. Moreover, there can be obtained a dielectric ceramic composition having a high relative dielectric constant within the high-frequency region, particularly within the microwave region and the millimeter wave region, as well as excellent temperature stability.

Therefore, such a dielectric ceramic composition can be fired simultaneously with a low specific-resistance internal electrode made of gold, silver, copper, etc., and there can be obtained ceramic electronic parts such as dielectrics and multilayer circuit boards containing such an internal electrode therein and having excellent high-frequency characteristics. Ceramic electronic apparatus such as an LC resonator and an LC filter having a high dielectric constant and a high Q value can be further miniaturized in a lamination method making use of the dielectric ceramic composition.

What is claimed is:

1. A dielectric ceramic composition comprising a mixture of a first $BaO-TiO_2-REO_{3/2}$ ceramic composition in which RE represents at least one rare earth element and a glass composition, wherein the glass composition comprises about 13–50 wt. % $SiO_2$, about 3–30 wt. % $B_2O_3$, about 40–80 wt. % alkaline earth metal oxide and about 0.5–10 wt. % $Li_2O$.

2. The dielectric ceramic composition according to claim 1, which further comprises CuO as a secondary component.

3. The dielectric ceramic composition according to claim 2, wherein the first $BaO-TiO_2-REO_{3/2}$ ceramic composition is represented by $xBaO-yTiO_2-zREO_{3/2}$ wherein x, y, and z are mole % and satisfy the following relations: $5 \leq x \leq 15$, $52.5 \leq y 70$, $15 \leq z \leq 42.5$; and $x+y+z=100$, and the composition contains PbO in an amount of about 20 parts by weight or less with respect to 100 parts by weight of the first ceramic composition.

4. The dielectric ceramic composition according to claim 3, wherein the alkaline earth metal oxide contained in the glass composition comprises BaO and at least one species selected from the group consisting of SrO, CaO and MgO, and the compositional proportions of the SrO, CaO, MgO and BaO fall within the ranges of about 35 wt. % or less, about 35 wt. % or less, about 20 wt. % or less and about 40–95 wt. %, respectively.

5. The dielectric ceramic composition according to claim 4, wherein the first ceramic composition is about 80–95 wt. %, the glass composition is about 5–20 wt. % and CuO is about 3 wt. % or less.

6. The dielectric ceramic composition according to claim 5, which comprises at least one species of a second ceramic composition selected from the group consisting of $TiO_2$, $CaTiO_3$, $SrTiO_3$ and $Nd_2Ti_2O_7$.

7. The dielectric ceramic composition according to claim 6, wherein the first ceramic composition is about 50–95 wt. %, the glass composition is 5–20 wt. %, CuO is about 3 wt. % or less and the second ceramic composition is about 30 wt. % or less.

8. The dielectric ceramic composition according to claim 2, wherein the alkaline earth metal oxide contained in the glass composition comprises BaO and at least one species selected from the group consisting of SrO, CaO and MgO, and compositional proportions of the SrO, CaO, MgO and BaO fall within the ranges of about 35 wt. % or less, about 35 wt. % or less, about 20 wt. % or less and about 40–95 wt. %, respectively.

9. The dielectric ceramic composition according to claim 2, which comprises at least one species of a second ceramic composition selected from the group consisting of $TiO_2$, $CaTiO_3$, $SrTiO_3$ and $Nd_2Ti_2O_7$.

10. The dielectric ceramic composition according to claim 9, wherein the first ceramic composition is about 50–95 wt. %, the glass composition is about 5–20 wt. %, CuO is about 3 wt. % or less and the second ceramic composition is about 30 wt. % or less.

11. The dielectric ceramic composition according to claim 1, wherein the first $BaO$—$TiO_2$—$REO_{3/2}$ ceramic composition is represented by $xBaO$—$yTiO_2$—$zREO_{3/2}$ (wherein x, y, and z are mole % and satisfy the following relations: $5 \leq x \leq 15$, $52.5 \leq y \leq 70$, $15 \leq z \leq 42.5$; and x+y+z=100), and contains PbO in an amount of about 20 parts by weight or less with respect to 100 parts by weight of the first ceramic composition.

12. The dielectric ceramic composition according to claim 1, wherein the alkaline earth metal oxide contained in the glass composition comprises BaO and at least one species selected from the group consisting of SrO, CaO and MgO, and compositional proportions of the SrO, CaO, MgO and BaO fall within the ranges of about 35 wt. % or less, about 35 wt. % or less, about 20 wt. % or less and about 40–95 wt. %, respectively.

13. The dielectric ceramic composition according to claim 12, which comprises at least one species of a second ceramic composition selected from the group consisting of $TiO_2$, $CaTiO_3$, $SrTiO_3$ and $Nd_2Ti_2O_7$.

14. A ceramic electronic part which comprises an electrically conductive element and a dielectric ceramic layer comprising the dielectric ceramic composition of claim 1.

15. The ceramic electronic part of claim 14 comprising:
an internal electrode comprising at least one of Au, Ag and Cu disposed in said dielectric ceramic layer; said part having been fired at a temperature about 1000° C. or less.

16. A ceramic electronic part which comprises an electrically conductive element and a dielectric ceramic layer comprising the dielectric ceramic composition of claim 2.

* * * * *